US007888252B2

(12) United States Patent
Faltermeier et al.

(10) Patent No.: US 7,888,252 B2
(45) Date of Patent: Feb. 15, 2011

(54) SELF-ALIGNED CONTACT

(75) Inventors: Johnathan E. Faltermeier, Delanson, NY (US); Stephan Grunow, Poughkeepsie, NY (US); Kangguo Cheng, Guilderland, NY (US); Kevin Petrarca, Newburgh, NY (US); Kaushik Kumar, Poughkeepsie, NY (US); Lawrence A. Clevenger, LaGrangeville, NY (US); Shom Ponoth, Clifton Park, NY (US); Vidhya Ramachandran, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 12/372,174

(22) Filed: Feb. 17, 2009

(65) Prior Publication Data

US 2010/0210098 A1 Aug. 19, 2010

(51) Int. Cl.
*H01L 21/3205* (2006.01)
*H01L 21/4763* (2006.01)
(52) U.S. Cl. ............... 438/586; 438/618; 257/E21.545
(58) Field of Classification Search ........... 438/586, 438/618; 257/E21.545
See application file for complete search history.

(56) References Cited

U.S. PATENT DOCUMENTS 6,297,110 B1 * 10/2001 Chan et al. ................. 438/301
7,056,828 B2 * 6/2006 Chung et al. ............... 438/639
7,067,364 B1 * 6/2006 Lee ........................... 438/197
2001/0010961 A1 * 8/2001 Jung et al. .................. 438/279
2002/0094669 A1 * 7/2002 Park et al. .................. 438/586

OTHER PUBLICATIONS

J. Senkevich, et al.—"Selective Deposition of Ultrathin Poly(p-xylylene) Films on Dielectrics Versus Copper Surfaces"—Chemical Vapor Deposition—2004, 10, No. 5—pp. 247-249.
K. Vaeth, et al.—"Transition Metals For Selective Chemical Vapor Deposition of Parylene-Based Polymers"—2000 American Chemical Society—Published on Web Apr. 18, 2000—Chem Mater., vol. 12, No. 5, 2000—pp. 1305-1313.
E. Huang Thesis—"Controlling Polymer Thin Flim Structures by Tuning Inderfacial Interactions"—Elbert E. Huang Dissertation—Submitted to the Graduate School of The University of Massachusetts, Amherst—Feb. 2000—Polymer Science and Engineering.

* cited by examiner

*Primary Examiner*—Matthew S Smith
*Assistant Examiner*—John M Parker
(74) *Attorney, Agent, or Firm*—Joseph Petrokaitis (57) ABSTRACT

A method of forming contacts for semiconductor devices, the method including depositing an inter-level dielectric (ILD) over a plurality of gate stacks, in which the divots within the inter-level dielectric layer are defined by the spaces between the gate stacks, filling the divots with an initial fill material, depositing a masking material on the dielectric over the gate stacks, and selectively etching the fill material to form contact vias. The fill material may be a self-assembly material such as a multi-block copolymer in which the blocks self organize vertically within the divots, so that a selective etch of the block material will remove the vertically organized blocks from the divot, but leave at least one block over the gate regions. In another embodiment, the fill material may be a metal, and the masking material may be a parylene based polymer.

18 Claims, 12 Drawing Sheets

SELF-ALIGNED CONTACT

BACKGROUND

The present invention relates generally to the manufacture of semiconductor integrated circuits and, more particularly, to a method and structure for forming self-aligned contacts.

As the technology for integrated circuits continues to shrink, the challenges of manufacturing smaller and more densely spaced devices increase. For example, connecting the semiconductor devices together requires that electrical contact elements (CA) be formed by etching holes, or vias, through an insulating material to contact the source/drain terminals of the semiconductor transistor device, which are directly adjacent the device gate stack of the transistor, without damaging or shorting the device. This requires good alignment of the CA vias to the spaces between the transistors where the source/drain contacts will be made.

Accordingly, there is a need for improved methods for forming CA contacts that are aligned to the transistor gates.

SUMMARY

The foregoing discussed drawbacks and deficiencies of the prior art are overcome or alleviated, in an exemplary embodiment, by a method of forming contacts for semiconductor devices, the method including forming self-aligned contacts, the method comprising the steps of: providing a substrate including a plurality of gate stacks having a space between each of said plurality of gate stacks, said space exposing a contact adjacent said gate stacks; conformally depositing a dielectric over said substrate so that dielectric divots are formed in the top surface of said dielectric over said space between said each of said plurality of gate stacks; depositing a patterned masking layer over said dielectric layer, said patterned masking layer comprising openings aligned with and exposing said divots in said top surface of said dielectric; and etching said dielectric through said openings to expose said contacts.

In one embodiment, the method further comprises conformally depositing a random polymer layer within said dielectric divots, while leaving a top surface of said dielectric exposed over said gate stacks, conformally depositing a multi-block self-assembly layer on said exposed dielectric and on said random polymer layer within said dielectric divots, so that each of said block materials self-organizes vertically within said dielectric divots, etching one of said block materials selective to other of said block materials to form openings in said dielectric divots to expose said random polymer layer; and removing said random polymer layer through said openings so as to remove the remaining block materials from said dielectric divot to expose said dielectric within said dielectric divot, while leaving at least one layer of said block materials covering said dielectric over said gate stacks.

In another embodiment, the method further comprises depositing a fill material in said dielectric divots and leaving the top surface of said dielectric over said gate stacks uncovered by said fill material, depositing a selective masking material that adheres to said dielectric material but not said fill material so that said selective masking material covers said dielectric material over said gate stacks but not said fill material in said dielectric divots, and removing said fill material from said dielectric divots.

BRIEF DESCRIPTION OF THE DRAWINGS

Referring to the exemplary drawings wherein like elements are numbered alike in the several drawings:

FIGS. 1A through 10B are a sequence of top down and cross sectional views illustrating one embodiment of a method of forming contacts for semiconductor devices, in accordance with an embodiment of the invention.

DETAILED DESCRIPTION

Figure 1A:
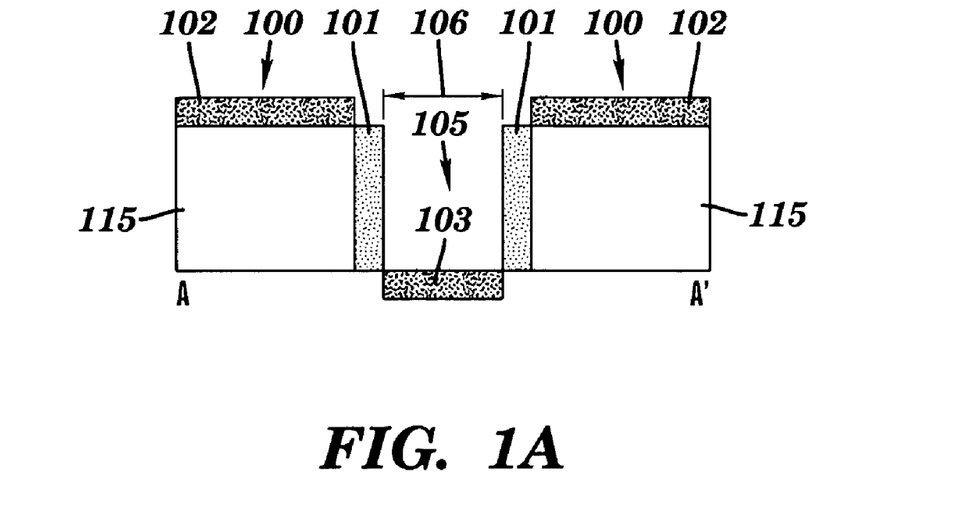
Figure 1B:
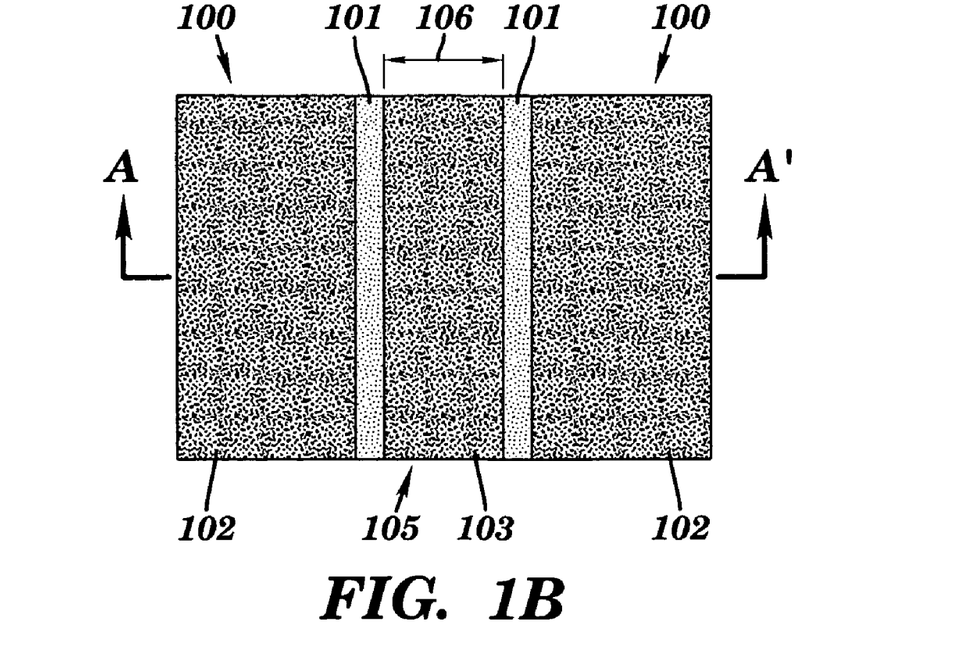

Disclosed herein is a method of a method and structure for forming contacts that are self-aligned to the spaces between the gate stacks of field effect transistor (FET) devices. Referring to FIG. 1A, illustrating a cross-section view, and 1B, illustrating a top down view, of a plurality of densely spaced FET devices, that include conductive lines 100 (e.g. polysilicon lines) that include a conductive material 105, such as polysilicon, insulating sidewalls 101, and a metal alloy cap 102 atop the conductive material 115, and a metal alloy layer 103 at the source/drain region of the FET devices to which contacts are to be provided for electrical interconnection. Other features may also be present, such as shallow trench isolation (STI), as known in the art, but are not shown for clarity of illustration. The spaces 105 between gate stacks 100 have spacing 106 that has a width typically in the range from about 30-100 nm. Typical conducting lines (or gate stacks) 100 may have widths in the range from about 20-90 nm. Spacers 101 may typically range from 2-30 nm. The conducting material 115 may have thicknesses in the range from about 5-50 nm. Aspect ratios (depth to width) of the space 105 between gate stacks 100 are typically in the range from about 4:1 to about 8:1.

Figure 2A:
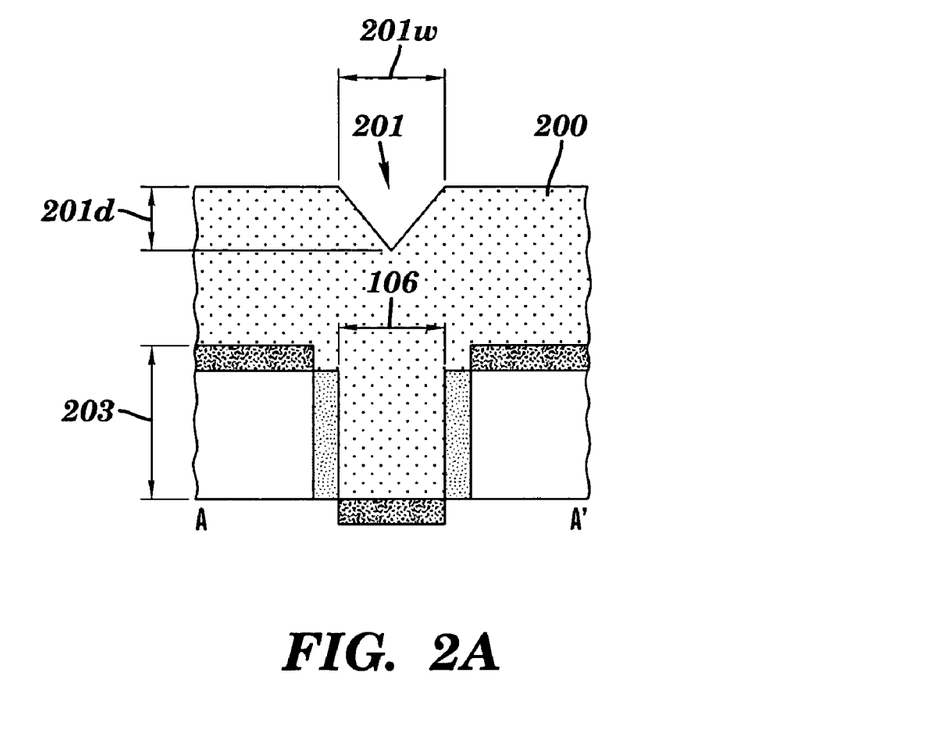
Figure 2B:
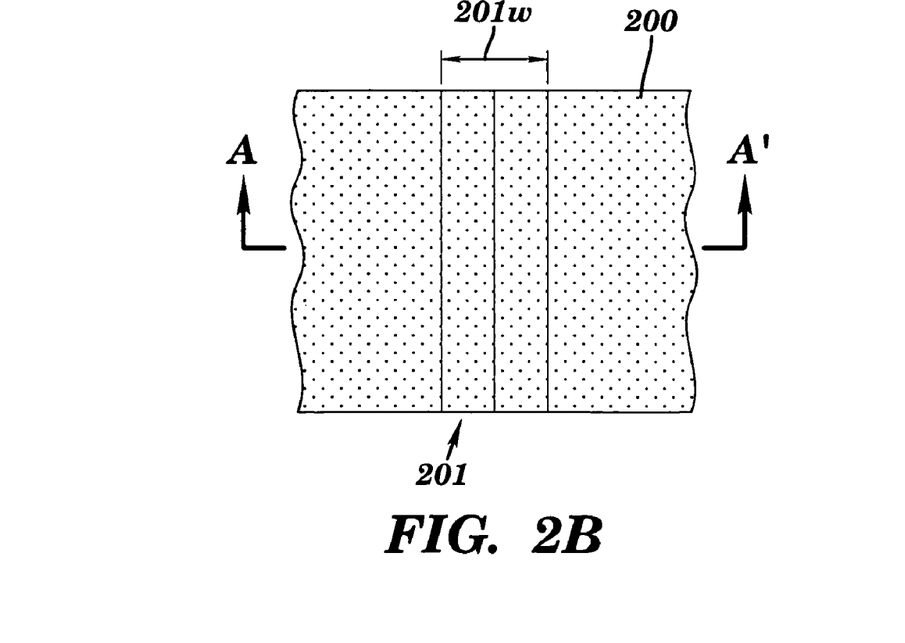

Referring to FIGS. 2A and 2B, an interlayer dielectric (ILD) 200 is deposited by a method such as chemical vapor deposition (CVD), or Atomic layer deposition (ALD). Since the process of deposition of the ILD is conformal, divots 201 will be formed in the surface of the ILD layer where the spaces are located. The processes of depositing insulating materials are well known in the art. The divot 201 can be varied is size (i.e. width and depth) by adjusting the deposition parameters, such as deposition rate, power, pressure, gas flow, and the like. In a preferred embodiment, the width 201w of the divot 201 is designed to be substantially similar to the width 106 of the space 105 between gate stacks. In a preferred embodiment, the depth 201d of the divot 201 is in the range from about 3 to about 50 nm (about 30-500 Å), and more preferably less than about 300 Å, to conform to the most efficient thickness for diblock perforation as discussed further below. In conventional processing, divots formed during the conformal deposition of the ILD are typically removed by planarization prior to the opening of contact vias. By contrast, in accordance with the present invention, the divots 201 are used to assist in the alignment and opening of the contact vias. Because the divots 201 formed are aligned with the space 105 between the gate conductor lines or gate stacks 100, and therefore with the silicided source/drain regions adjacent the gate stacks of the FET devices, the contacts will be self-aligned.

In accordance with the present invention, a masking material is provided atop the ILD over the gate stacks, while using the divots to provide patterned openings in the masking material that are self-aligned to the spaces. The patterned openings aligned to the ILD divots may be used, for example, to open vias for the contacts.

Figure 3A:
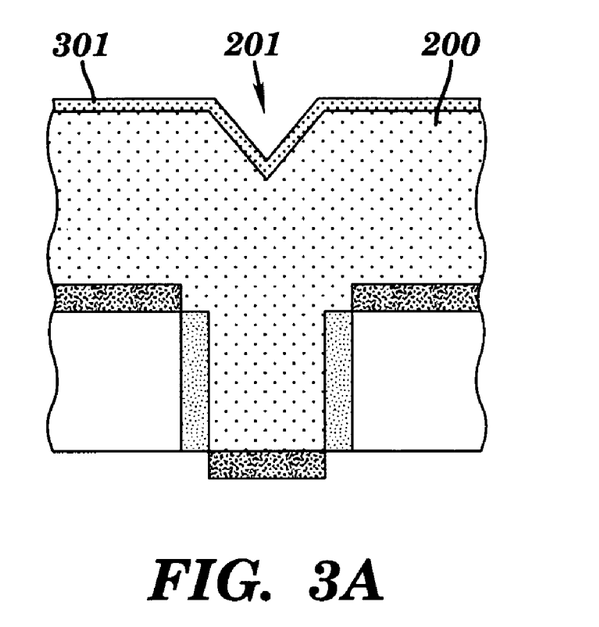
Figure 3B:
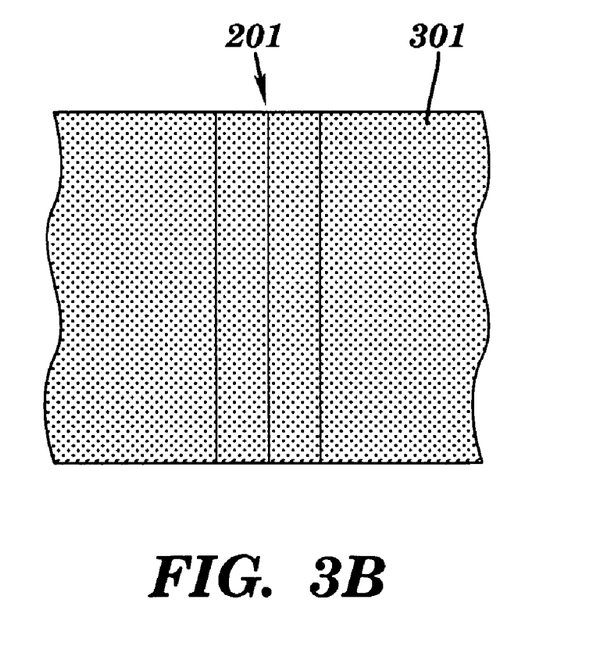

In a first embodiment, after the divots 201 in the ILD have been formed, a 'random' polymer layer 301 (see FIGS. 3A and 3B) is deposited conformally atop the ILD 200 by spin coating. The random polymer 301 is a neutral polymer that has equal affinity to both phases of a diblock copolymer 601 that will be subsequently deposited within the divots 201. For example, if the subsequent diblock copolymer 601 is a PS-PMMA diblock, the random polymer is a PS-PMMA based random polymer, the composition of which is tuned, typically having about 60% PS, to have equal affinity to both PS and PMMA.

Figure 4A:
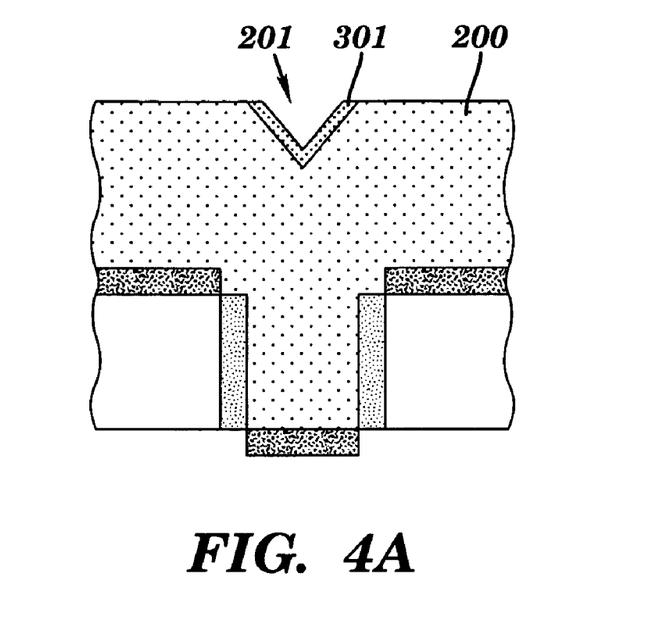
Figure 4B:
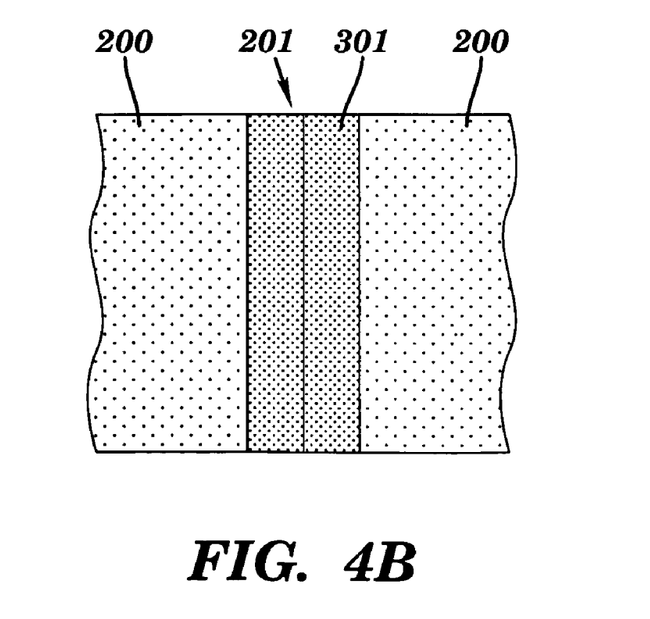

The random polymer layer 301 provides the necessary surface characteristics for correct orientation of a self-assembly layer 601, such as a diblock copolymer layer, to be subsequently deposited (see FIGS. 5A and 5B). The thickness of the random copolymer layer 301 may be in the range 50-100 Å. The random polymer 301 is grafted on the surface of the ILD 200 by first spin coating a relatively thick film (e.g. greater than about 100 Å) followed by a cure in which the random polymer 301 grafts onto the surface of the ILD 200. A solvent rinse is then subsequently done to remove excess unbound random polymer, leaving a grafted random polymer layer 301, typically having thickness less than about 100 Å. The random polymer layer 301 is subsequently removed from regions outside the divot 201 by a method such as chemical-mechanical polishing (CMP), resulting in FIGS. 4A and 4B. The composition of the random polymer layer 301 and subsequently deposited diblock copolymers 601 (see FIGS. 5A and 5B) are tuned such that a perpendicular orientation of the self-assembly is obtained for the diblock polymer 601 that is on top of the random layer 301 in the divot 201. In a preferred embodiment, the thickness of the random layer 301 is less than 100 Å, so that the decrease in the width 201w of the divot 201 will be less than about 200 Å.

Figure 5A:
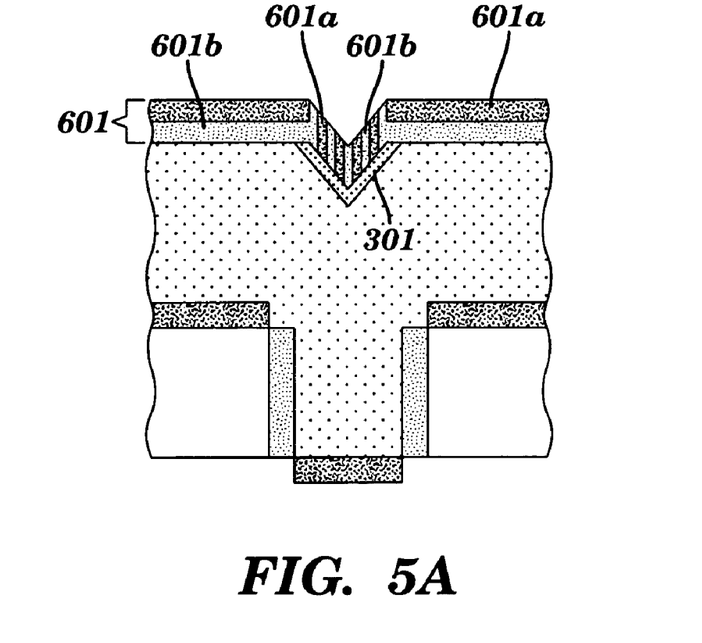
Figure 5B:
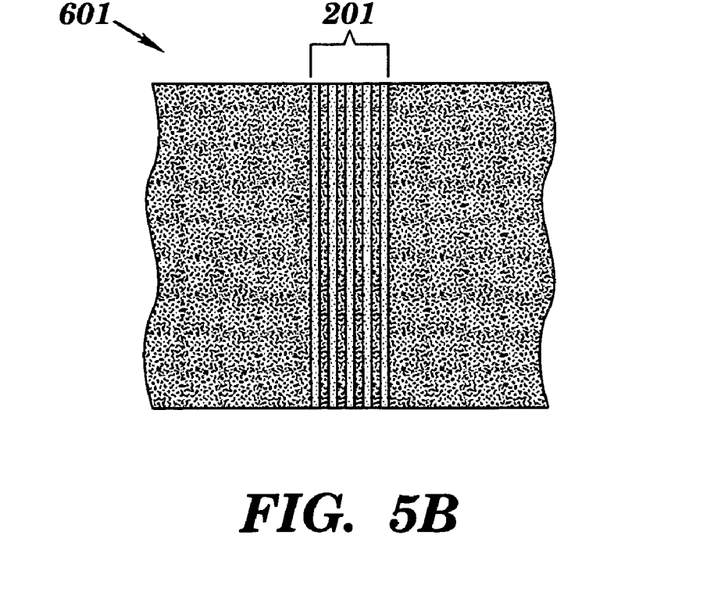

Referring to FIGS. 5A and 5B, a self-assembly material 601 is deposited conformally atop the random layer 301. Preferably, the self-assembly material 601 is a block copolymer or a diblock material.

It has been known that certain materials are capable of spontaneous organization into ordered patterns without the need for human interference, which is typically referred to as the "self-assembly" of materials. Examples of self-assembling material patterns range from snowflakes to seashells to sand dunes, all of which form some type of regular or ordered pattern in response to the external conditions.

Among various self-assembling materials, self-assembling multi-block copolymers that are capable of self-organizing into nanometer-scale patterns are particularly promising for enabling future advances in the semiconductor technology. Each self-assembling block copolymer system typically contains two or more different polymeric block components that are immiscible with one another. Under suitable conditions, the two or more immiscible polymeric block components separate into two or more different phases on a nanometer scale and thereby form ordered patterns of isolated nano-sized structural units.

The ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 10 to 40 nm, which are sub-lithographic (i.e., below the resolutions of existing lithographic tools). Further, the self-assembling block copolymers are compatible with conventional semiconductor, optical, and magnetic processes. Heretofore, exemplary applications of the ordered patterns of nano-sized structural units formed by such block copolymers in the semiconductor industry have been limited to the formation of certain semiconductor, optical, and magnetic devices where a large, ordered array of repeating structural units is required.

In one embodiment, the self-assembly material is a Polystyrene (PS)-Poly(methyl methacrylate) (PMMA) block copolymer system, as known in the art. The ratio of the two block controls the morphology (eg spherical, cylindrical, lamellar) of the copolymer. For this particular application, the lamellar morphology (for which the composition is typical 50% each PS and PMMA) is preferable. In FIG. 5A, 601a represents one block of the diblock material whereas 601b represents the other block, where one block has greater affinity to the underlying dielectric layer 200. In the example illustrated in FIG. 5A, the second block 601b has a greater affinity to the ILD material 200 than the first block 601a. Alternatively, the first block material 601a may have a greater affinity to the ILD than the second block material 601b, and the invention is not so limited. The material system is chosen such the first block 601a can be removed selectively compared to the second block 601b and ILD material 200. In one embodiment, the first block material 601a is PMMA and the second block material 601b is Polystyrene (PS).

Referring again to FIGS. 5A and 5B, a horizontal lamellar assembly of the diblock material occurs in regions over the ILD 200 there is no random layer 301. Whether the first block material 601a is above or below the second block material 601b is not critical in the ILD regions over the gate stack. Within the divot 201, vertical orientation of the diblock 601a, 601b, is achieved due to the presence of the random layer 301. The composition of the random layer 301 is tuned to have equal affinities to both 601a and 601b and that is critical for the vertical orientation of the self-assembly material 601. Although self-assembled lines are illustrated in FIG. 5B, the self-assembled openings may be holes, and the invention is not limited by the type of self-assembly pattern formed in the divot regions 201.

The diblock layer 601 may be formed over the device by a spin-on coating technique. The diblock coating 601, in an exemplary embodiment, includes a copolymer mixture of polystyrene (PS) 106b and poly(methyl-methacrylate) (PMMA) 106a. The diblock coating 601 may be subsequently cured. The PS block polymer 106b and PMMA polymer 106b is rearranged within the divot region 201 containing the random polymer layer 301 to form a regular vertical nano-scale pattern as shown in FIGS. 5A, 5B. More specifically, by ensuring that the random material 301 exists only in the divot locations 201, an ordered pattern of nano-scale openings may be defined over the divot regions 201.

Figure 6A:
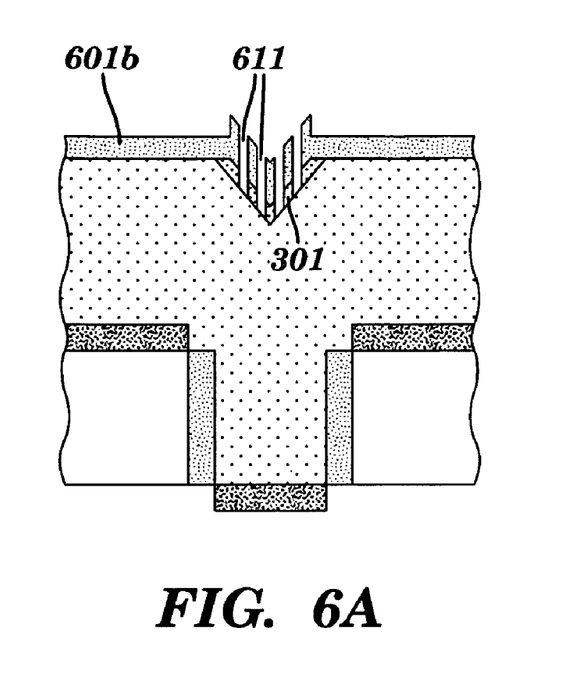
Figure 6B:
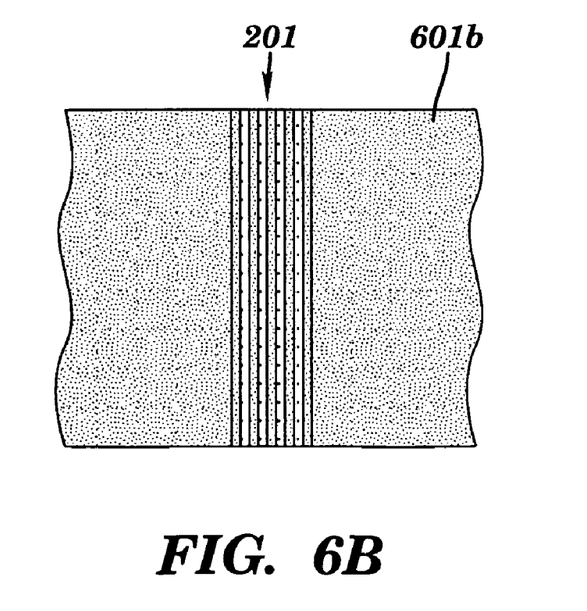
Figure 7A:
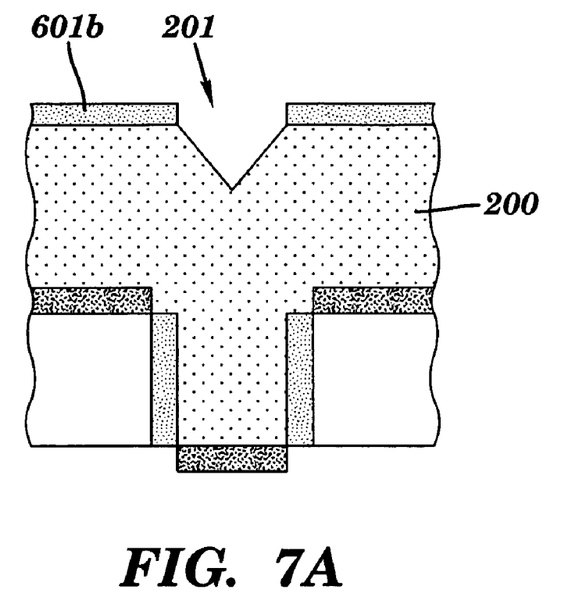
Figure 7B:
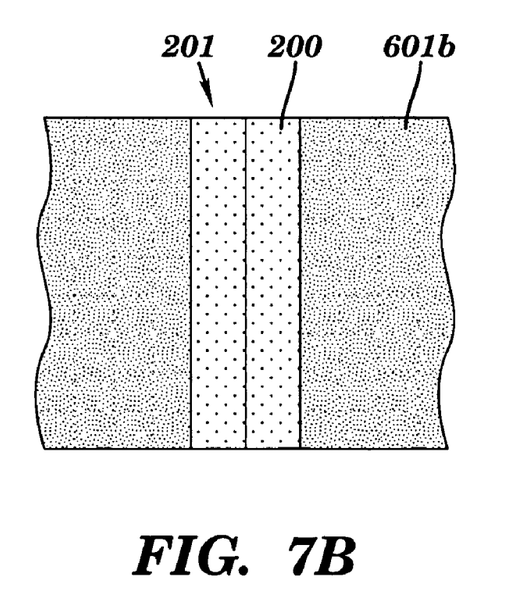

As indicated above, the nano-scale patterns formed by anneal or cure of a diblock copolymer are on the order of about 10 to 40 nm in diameter, which are sub-lithographic in terms of existing photolithographic technology. Following the anneal and development of the diblock material 601, an etch of one phase of the diblock material, for example, first block material 601a, is performed, such as a reactive ion etch (RIE), leading to openings 611 in FIGS. 6A and 6B. The RIE etch of the material 601a is primarily directional, and is selective to the second block material 601b. The random layer 301 is also removed in the openings 611. This is followed by an isotropic etch (eg dilute HF wet etch) to undercut and lift off the second block 601b lines in the divot 201 to result in complete exposure of the ILD material 200 in the divot 201. The resulting structure is illustrated in FIGS. 7A and 7B, in which the underlying ILD material 200 is exposed in the divot regions 201.

Figure 8A:
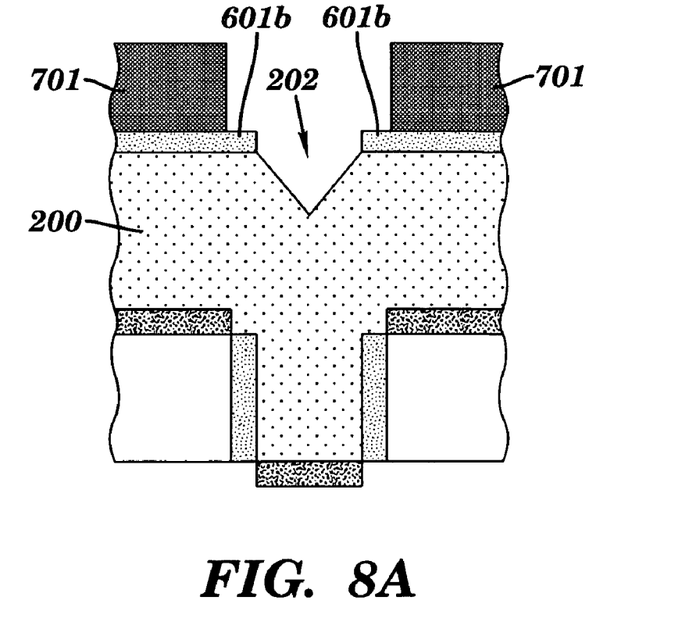
Figure 8B:
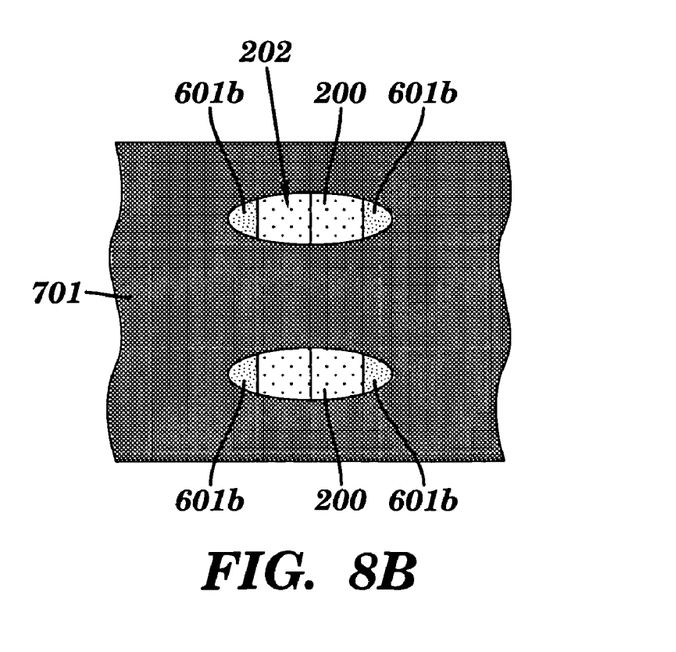
Figure 9A:
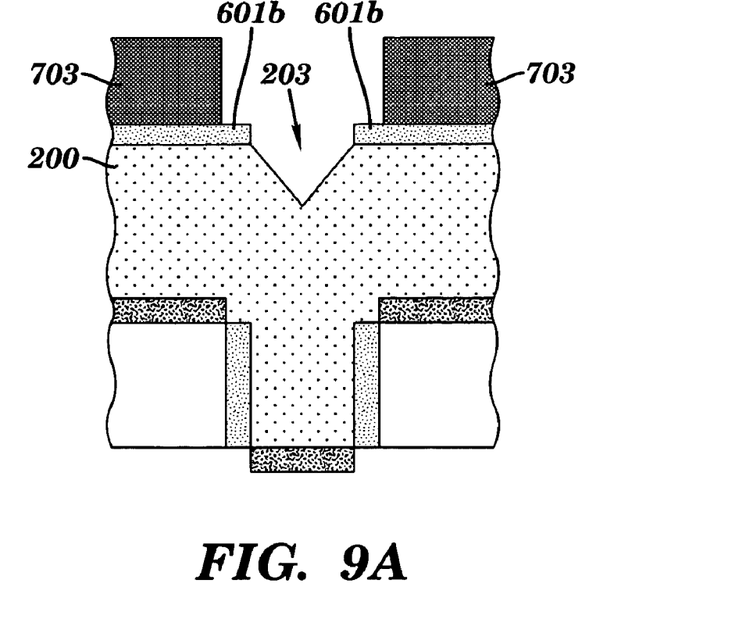
Figure 9B:
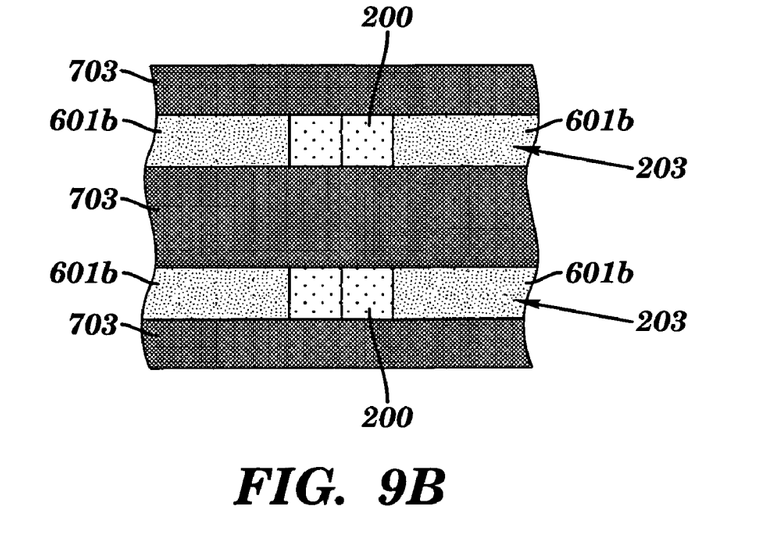

Next, the contact vias are patterned to be opened. For example, referring to FIGS. 8A and 8B, a patterned resist layer 701 may be deposited, having via openings 202. Alternatively, referring to FIGS. 9A and 9B, a rectangular resist pattern 703 having rectangular openings 203 that are oriented in a direction perpendicular to the orientation of the divot regions 201. The rectangular openings 203 combined with the orthogonal openings 201 in the 601*b* provide rectangular openings exposing the ILD 200 for the contact vias.

Figure 10A:
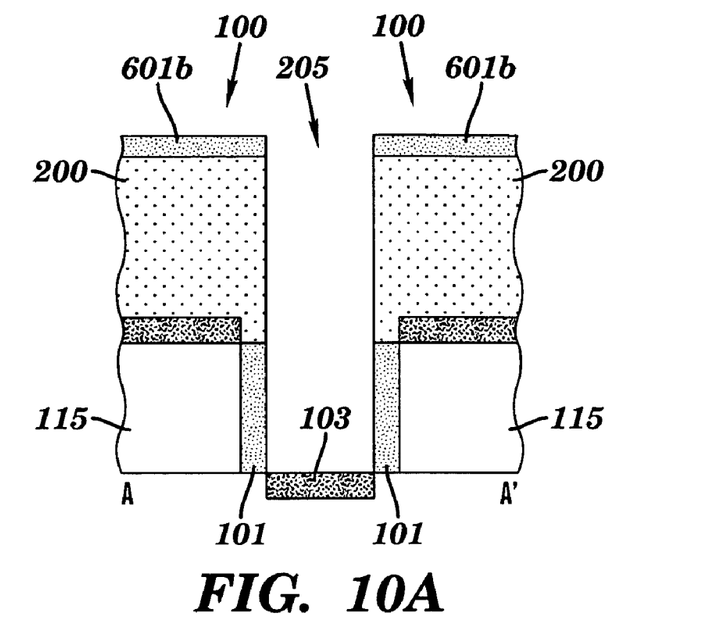
Figure 10B:
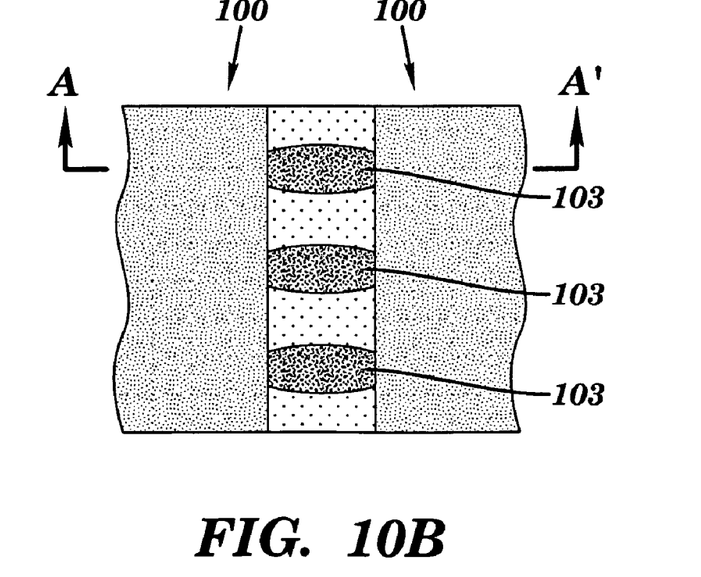

Referring to FIG. 10A, the contact vias 205 are opened by an anisotropic etch of the ILD 200 selective to 601*b*. The anisotropic etch is preferably performed by Reactive Ion Etching (RIE), which is well known in the art. A common RIE process would utilize CF4. This etch will volatilize the expose ILD 200 thereby causing it to be removed. The importance is to have this opening go down to the silicide 103 that is between the gate stack structures 100. The insulative spacers 101 that reside on the sides of the gate conductor 115 will prevent the filled opening 205 (when filled with a conductor) from shorting to the gate 115.

Then the contact vias 205 may be filled with conductive material, such as tungsten which is commonly used with a titanium and titanium nitride liner. These are usually deposited in a vapor deposition type process. In a preferred embodiment, chemical vapor deposition (CVD) is used for example, however, there are other methods that are well know in the industry. These would include PECVD, IPCVD, ALD and sputtering (columnated and non-columnated). These materials are deposited in blanket form (covering all exposed surfaces). The work piece is then polished, using for example, chemical mechanical polishing (CMP). CMP uses a slurry that an oxidizing property. The work piece is exposed to this oxidizing slurry in a controlled manner and there are abrasive properties in the slurry and on the polishing pad that abrade the oxidized material off the work piece. This continues until the polishing process removes the conductive material that was deposited except for in the opening we created thereby forming the contact that is between the gate stacks.

Figure 11:
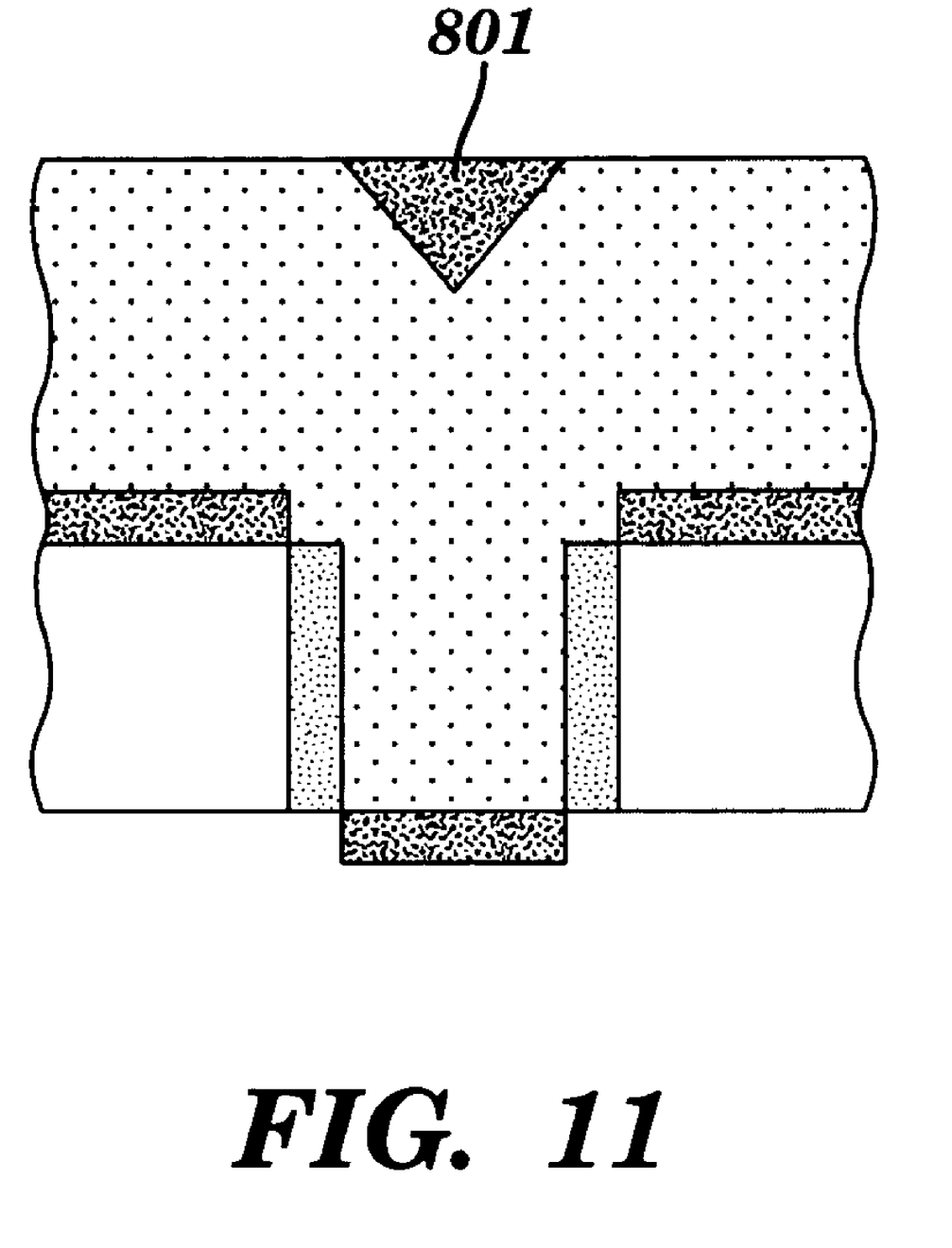
FIGS. 11-13 are a sequence of cross sectional views illustrating another embodiment of a method of forming contacts, in accordance with the invention.

Referring to FIG. 11, In another embodiment in accordance with the invention, a fill material 801 is deposited in the dielectric divots 201. The fill material 801 has the characteristic that it is easily deposited and formed into the divot and can be removed by means of a selective etch. For copper a simple selective etch would be 4% acetic acid, 5% H2O2 in a DI water medium. At room temperature this will etch about 200 angstroms of copper a minute. It will also have no affect on the insulators that reside on the work piece. There are many known etchants for copper. In a preferred embodiment, the fill material 801 is copper. The fill material 801 could include Ta, Fe, Ru, Co, Ni, Pd, Pt, Cu, Ag, and Au. In a preferred embodiment, the fill material 801 fills the divots 201 but does not cover the surface of the dielectric 200 over the gate stack regions 100.

Figure 12:
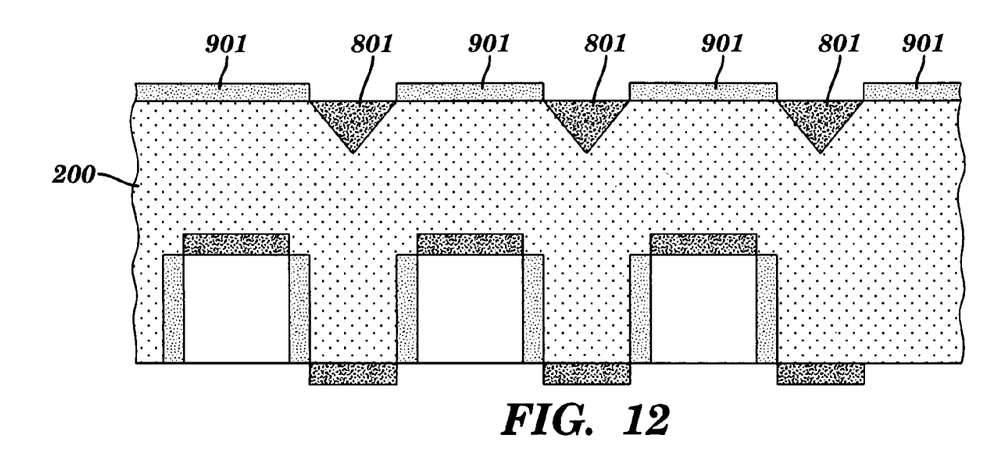
Figure 13:
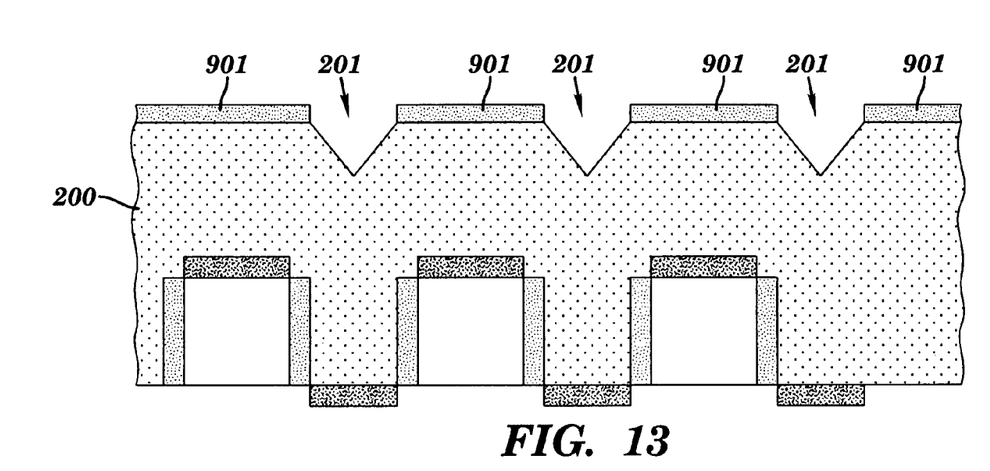

Referring to FIG. 12, a selective masking material 901 is selectively deposited on the top surface of the dielectric 200 but not over the fill material 801 in the dielectric divots 201. The selective masking material 901 has the characteristics that it deposits selectively on dielectric over metallic surfaces. In a preferred embodiment, the selective masking material 901 is parylene based polymer, such as parylene-N or parylene-C.

Next, the fill material 801 is removed from the divots 201 selectively to the selective masking material 901 to expose the underlying dielectric 200 at the divots 201. This process can be performed by any dry or wet process, which is selective between material 801 and 901. In the case of the preferred embodiment of paryline and Cu, H$_2$SO$_4$ wet chemistry could be employed. Then the opening of contact vias (not shown) may be performed by methods known in the art, such as a dry etch process. Then, the selective masking material 901 may be removed, for example, by dry ashing in O2, wet organic strip (Such as sulfuric peroxide) or the paryline could be left in place. Then the contacts may be filled with conductive material, such as TiN, W, Cu, TaN or any such conductor that can be conformally deposited.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming self-aligned contacts, the method comprising the steps of:
   providing a substrate including a plurality of gate stacks having a space between each of said plurality of gate stacks, said space exposing a contact adjacent said gate stacks;
   conformally depositing a dielectric over said substrate so that dielectric divots are formed in the top surface of said dielectric over said space between said each of said plurality of gate stacks;
   depositing a patterned masking layer over said dielectric layer, said patterned masking layer comprising openings aligned with and exposing said divots in said top surface of said dielectric, wherein said step of depositing a patterned masking layer comprises:
      conformally depositing a random polymer layer within said dielectric divots, while leaving a top surface of said dielectric exposed over said gate stacks;
      conformally depositing a multi-block self-assembly layer on said exposed dielectric and on said random polymer layer within said dielectric divots, so that each of said block materials self-organizes vertically within said dielectric divots;
      etching one of said block materials selective to other of said block materials to form openings in said dielectric divots to expose said random polymer layer; and
      removing said random polymer layer through said openings so as to remove the remaining block materials from said dielectric divot to expose said dielectric within said dielectric divot, while leaving at least one layer of said block materials covering said dielectric over said gate stacks; and
   etching said dielectric through said openings to expose said contacts.

2. The method of claim 1, wherein the self-assembly layer comprises a copolymer mixture of polystyrene (PS) and poly (methyl-methacrylate) (PMMA).

3. The method of claim 1, wherein said random polymer layer comprises a neutral polymer that has equal affinity to each of said block materials of said multi-block self-assembly layer.

4. The method of claim 1, wherein the self-assembly layer comprises a copolymer 50:50 mixture of polystyrene (PS) and poly(methyl-methacrylate) (PMMA), and wherein said random polymer layer comprises a PS-PMMA based polymer having about 60% PS.

5. The method of claim 1, wherein said random polymer layer has a thickness less than about 100 Å.

6. The method of claim 1, wherein said dielectric divot has a depth in the range from about 3-50 nm.

7. The method of claim 1, wherein said dielectric divot has a depth less than about 300 Å.

8. The method of claim 1, wherein said gate stacks comprise conductive lines arranged parallel to each other, and said block materials in said dielectric divots self-organize along lines parallel to said conductive lines.

9. The method of claim 1, wherein each of said block materials self-organizes horizontally and parallel to the surface of said dielectric over said gate stacks.

10. A method of forming self-aligned contacts, the method comprising the steps of:
   providing a substrate including a plurality of gate stacks having a space between each of said plurality of gate stacks, said space exposing a contact adjacent said gate stacks;
   conformally depositing a dielectric over said substrate so that dielectric divots are formed in the top surface of said dielectric over said space between said each of said plurality of gate stacks;
   depositing a patterned masking layer over said dielectric layer, said patterned masking layer comprising openings aligned with and exposing said divots in said top surface of said dielectric, wherein said step of depositing a patterned masking layer comprises:
      depositing a fill material in said dielectric divots and leaving the top surface of said dielectric over said gate stacks uncovered by said fill material;
      depositing a selective masking material that adheres to said dielectric material but not said fill material so that said selective masking material covers said dielectric material over said gate stacks but not said fill material in said dielectric divots; and
      removing said fill material from said dielectric divots; and
   etching said dielectric through said openings to expose said contacts.

11. The method of claim 10, wherein said selective masking material comprises a parylene based polymer.

12. The method of claim 10, wherein the fill material comprises copper.

13. The method of claim 12, wherein said removing said fill material from said dielectric over said gate stacks comprises chemical mechanical polishing.

14. The method of claim 10, wherein the fill material comprises a material selected from the group consisting of Ta, Fe, Ru, Co, Ni, Pd, Pt, Cu, Ag and Au.

15. The method of claim 10, wherein the step of depositing said fill material comprises depositing a blanket layer of said fill material on said dielectric, and removing said fill material from said dielectric over said gate stacks.

16. The method of claim 10, wherein said openings are filled with a conductive material.

17. The method of claim 16, wherein said conductive material comprises a material selected from the group consisting of TiN, W, Cu and TaN.

18. The method of claim 10, wherein said contacts comprise a silicided contact.

* * * * *